(12) United States Patent
Mitani et al.

(10) Patent No.: US 9,633,718 B1
(45) Date of Patent: Apr. 25, 2017

(54) NONVOLATILE MEMORY DEVICE

(71) Applicant: SII Semiconductor Corporation, Chiba-shi, Chiba (JP)

(72) Inventors: Makoto Mitani, Chiba (JP); Hironori Hayashida, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 15/284,962

(22) Filed: Oct. 4, 2016

(30) Foreign Application Priority Data

Oct. 8, 2015 (JP) ................. 2015-199860

(51) Int. Cl.
  *G11C 11/00* (2006.01)
  *G11C 11/419* (2006.01)
(52) U.S. Cl.
  CPC ................. *G11C 11/419* (2013.01)
(58) Field of Classification Search
  CPC .................................... G11C 11/419

USPC ....... 365/129, 154, 189.011, 189.15, 189.17, 365/189.07, 233.1, 233.11, 233.12
See application file for complete search history.

(56) References Cited

U.S. PATENT DOCUMENTS

2015/0039928 A1* 2/2015 Lin ................. H04N 21/43632
                                              713/600

FOREIGN PATENT DOCUMENTS

JP          2005-071512 A         3/2005

* cited by examiner

*Primary Examiner* — Fernando Hidalgo
(74) *Attorney, Agent, or Firm* — Brinks Gilson & Lione

(57) ABSTRACT

There is provided a nonvolatile memory device having a writing error preventing function with high noise resistance. This structure includes a switch and a noise filter circuit connected in parallel to a clock terminal, wherein a clock pulse monitoring circuit compares the number of clocks input from the clock terminal with a prescribed number, and when detecting abnormality in the number of clocks, switches to a noise countermeasure mode in which the switch is turned off to validate the noise filter circuit.

2 Claims, 2 Drawing Sheets

NONVOLATILE MEMORY DEVICE

RELATED APPLICATIONS

This application claims priority under 35 U.S.C. §119 to Japanese Patent Application No. 2015-199860 filed on Oct. 8, 2015, the entire content of which is hereby incorporated by reference.

BACKGROUND OF THE INVENTION

Field of the Invention

The present invention relates to a nonvolatile memory device, and more specifically to a function to prevent a writing error in the nonvolatile memory device.

Background Art

FIG. 3 is a block diagram of a writing circuit in a conventional nonvolatile memory device.

A conventional writing circuit 40 includes a control circuit 41, a clock counter 42, an overrun detection circuit 43, a status register 44, and an output circuit 45.

In a nonvolatile memory device that performs communication through a serial interface, data are written to memory cells as follows: Clocks are input to a clock (SCK) terminal after a chip select (CS) signal is validated, and a write command, an address, and write data are input sequentially to a data input (DI) terminal concurrently. Then, when a predetermined write time has elapsed since the CS signal was invalidated, data write processing to memory cells is ended.

The overrun detection circuit 43 compares a prescribed number of clocks acquired from the control circuit 41 with an actual number of clocks acquired from the clock counter 42. Here, when noise is mixed into the SCK terminal to make the number of clocks larger than the prescribed number, the overrun detection circuit 43 detects an overrun, and sets an overrun detection flag in the status register 44. Then, the nonvolatile memory device cancels the write processing.

The overrun detection flag in the status register 44 can be output to a data output (DO) terminal through the output circuit 45 to let an external master side recognize the clock overrun. Then, since the overrun detection flag is reset by inputting the CS signal again or the like, the master can retry the write processing.

[Patent Document 1] Japanese Patent Application Laid-Open No. 2005-71512

SUMMARY OF THE INVENTION

However, since the noise resistance of the conventional nonvolatile memory device remains unchanged in retrying the write processing, there is a high possibility that the write processing fails in the same manner, and repeating the same processing many times causes a problem that the write processing time becomes long.

The present invention has been made to solve the above problem and implement a writing error preventing function with high noise resistance.

In order to solve the conventional problem, a nonvolatile memory device providing a writing error preventing function of the present invention has the following structure.

The nonvolatile memory device includes: a first switch and a first noise filter circuit connected in parallel to a clock terminal; a command decoder circuit that decodes a command from data input from a data input terminal; a clock pulse monitoring circuit that compares the number of clocks input from the clock terminal with a prescribed number to detect abnormality in the number of clocks, and outputs an abnormality detection signal when the abnormality is detected; a clock pulse monitoring register that receives the abnormality detection signal and sets an abnormality detection flag; an output circuit that outputs the abnormality detection flag to the outside; and a mode selection circuit that switches between a first state and a second state according to the abnormality detection flag, wherein In the first state, the first switch is turned on to invalidate the first noise filter circuit, and in the second state, the first switch is turned off to validate the first noise filter circuit, and a data reading period after the abnormality detection flag is set is the second state.

According to the nonvolatile memory device providing the writing error preventing function of the present invention, since noise filter circuits are provided at a CS terminal and an SCK terminal to validate the noise filter circuits before write processing is retried, the noise resistance of the nonvolatile memory device is improved. Therefore, the possibility of a success in the write processing can be increased and hence the write processing time can be shortened.

DETAILED DESCRIPTION OF THE PREFERRED EMBODIMENT

An embodiment will be described below with reference to the accompanying drawings.

Figure 1:
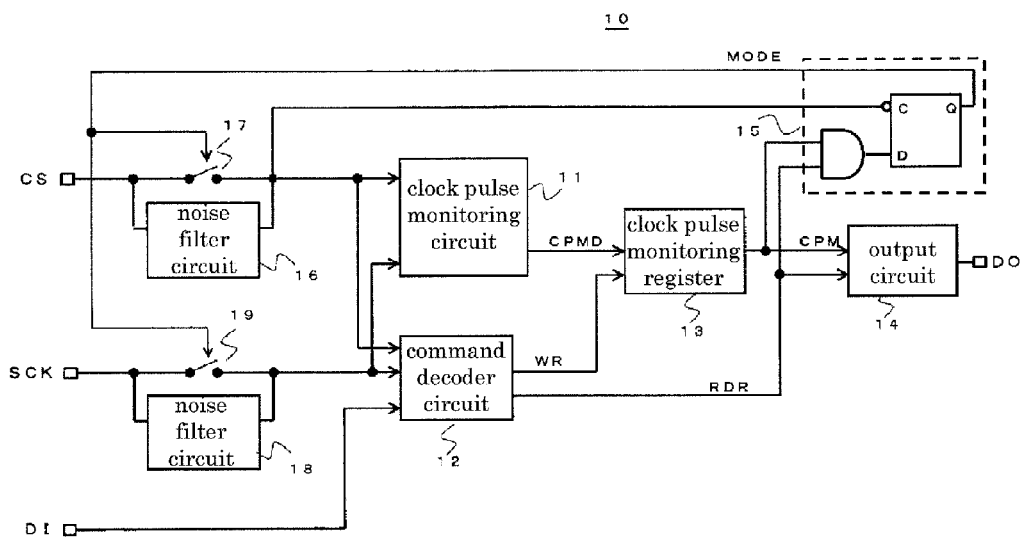
FIG. 1 is a block diagram of a writing circuit in a nonvolatile memory device of an embodiment.

FIG. 1 is a block diagram of a writing circuit in a nonvolatile memory device of the embodiment.

A writing circuit 10 of the embodiment includes a clock pulse monitoring circuit 11, a command decoder circuit 12, a clock pulse monitoring register 13, an output circuit 14, a mode selection circuit (a D-type flip-flop and an AND circuit) 15, noise filter circuits 16 and 18, and switch circuits 17 and 19.

The noise filter circuit 16 and the switch circuit 17 are connected in parallel, and provided between a chip select (CS) terminal and first input terminals of the clock pulse monitoring circuit 11 and the command decoder circuit 12. The noise filter circuit 18 and the switch circuit 19 are provided between a clock (SCK) terminal and second input terminals of the clock pulse monitoring circuit 11 and the command decoder circuit 12. A third input terminal of the command decoder circuit 12 is connected to a data input (DI) terminal. An output terminal of the clock pulse monitoring circuit 11 is connected to an input terminal of the clock pulse monitoring register 13. An output terminal of the clock pulse monitoring register 13 is connected to a first input terminal of the output circuit 14 and a first input terminal of the mode selection circuit 15. A first output terminal of the command decoder circuit 12 is connected to an input terminal of the clock pulse monitoring register 13, and a second output terminal thereof is connected to a second input terminal of the output circuit 14 and a second input terminal of the mode selection circuit 15. The CS terminal is connected to a third input terminal of the mode selection circuit 15, an output terminal of the mode selection circuit 15 is connected to control terminals of the switch circuits 17 and 19. A data output (DO) terminal is connected to an output terminal of the output circuit 14. The mode selection circuit 15 is internally connected as follows: The first input terminal and the second input terminal are connected to input terminals of the AND circuit, and an output terminal of the AND circuit is connected to a data (D) terminal of the D-type flip-flop. A clock (C) terminal of the D-type flip-flop is connected to the third input terminal, and an output (Q) terminal of the D-type flip-flop is connected to the output terminal.

The clock pulse monitoring circuit 11 detects that noise is mixed into the SCK terminal to make the number of clocks larger than a prescribed number or that noise is mixed into the CS terminal to make the number of clocks smaller than the prescribed number, and outputs an abnormality detection (CPMD) signal to cancel write processing. The command decoder circuit 12 decodes commands based on clocks and data input to the DI terminal, and outputs signals corresponding to the commands, namely a write (WR) signal from the first output terminal and a read (RD) signal of the clock pulse monitoring register 13 from the second output terminal. The clock pulse monitoring register 13 receives a CPMD signal from the clock pulse monitoring circuit 11, and outputs a (CPM) signal indicative of a state of setting an abnormality detection flag. The output circuit 14 outputs, to the DO terminal, the abnormality detection flag in the clock pulse monitoring register 13, and the like. The mode selection circuit 15 outputs a mode selection (MODE) signal to switch between a normal mode and a noise countermeasure mode according to the CPM signal and the RD signal. When the mode selection circuit 15 switches to the noise countermeasure mode, the switch circuits 17 and 19 are turned off to validate the noise filter circuits 16 and 18.

In the writing circuit 10 of FIG. 1, circuits such as a memory (data storage unit) and a data register, and a memory data reading function are omitted.

The above-mentioned writing circuit 10 operates in a manner to be described later to provide a writing error preventing function with high noise resistance.

In the nonvolatile memory device that performs communication through a serial interface, data are written to memory cells as follows: Clocks are input to the SCK terminal after a chip select (CS) signal is validated, and a write command, an address, and write data are input sequentially to the DI terminal concurrently. Then, when a predetermined write time has elapsed since the CS signal was invalidated, data write processing to memory cells is ended.

Figure 2:
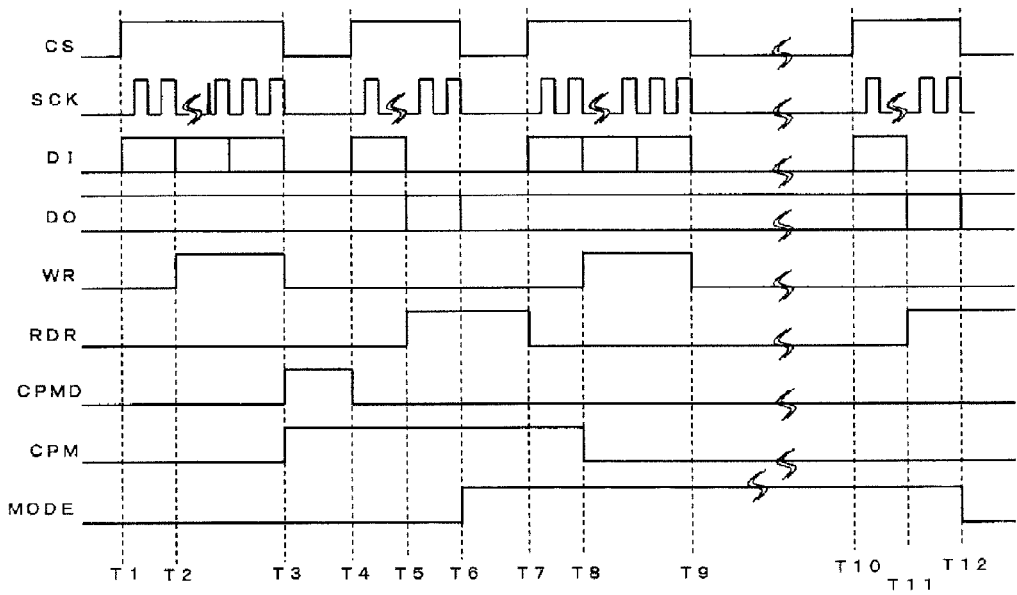
FIG. 2 is a timing chart illustrating the operation of the writing circuit in the nonvolatile memory device of the embodiment.
Figure 3:
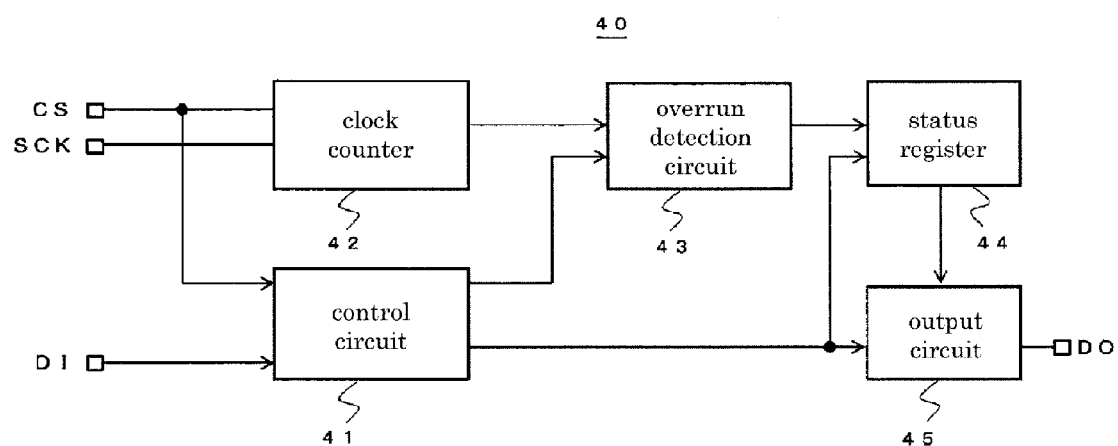
FIG. 3 is a block diagram of a writing circuit in a conventional nonvolatile memory device.

FIG. 2 is a timing chart illustrating the operation of the writing circuit in the nonvolatile memory device of the embodiment.

The timing chart of FIG. 2 illustrates a state where noise is generated at the SCK terminal during the write processing.

<Write Processing 1>

The period of write processing 1 is a period from timing T1 to timing T3. The WR signal is changed to H at timing T2 when the command decoder circuit 12 recognizes the write command. After that, when noise is generated at the SCK terminal during the period from timing T2 to timing T3 to cause clock abnormality, the clock pulse monitoring circuit 11 detects the clock abnormality at timing T3 when the CS signal falls, and outputs the CPMD signal at H. When the CPMD signal is changed to H, the clock pulse monitoring register 13 sets an abnormality detection flag to output the CPM signal at H.

<Read Processing 1 of Clock Pulse Monitoring Register>

Read processing 1 of the clock pulse monitoring register is a period from timing T4 to timing T6. The RD signal is changed to H at timing T5 when the command decoder circuit 12 recognizes a read command. Then, the CPM signal at H is output from the output circuit 14 during a period from timing T5 to timing T6. Since both the CPM signal and the RD signal are at H at timing T6 when the CS signal falls, input at the D terminal of the D-type flip-flop in the mode selection circuit 15 is changed to H to change the MODE signal to H. Therefore, the mode is switched to the noise countermeasure mode to turn the switches 17 and 19 off so as to validate the noise filter circuits 16 and 18.

In the embodiment, the timing of changing the CPMD signal to L is set to the timing when the CS signal rises, but the CPMD signal only has to be changed to L before the CPM signal is updated.

<Write Processing 2>

The period of write processing 2 is a period form timing T7 to timing T9. The WR signal is changed to H at timing T8 when the command decoder circuit 12 recognizes the write command. At this time, the clock pulse monitoring register 13 is reset to change the CPM signal to L. During this period, since the mode is the noise countermeasure mode to validate the noise filter circuits 16 and 18 at the CS terminal and the SCK terminal, the write processing is ended normally with high noise resistance. Since the clock pulse monitoring circuit 11 does not detect clock abnormality at timing T9 when the CS signal falls, the CPMD signal is kept at L. Further, since both the CPM signal and the RD signal are at L, input at the D terminal of the D-type flip-flop in the mode selection circuit 15 is changed to L to change the MODE signal to L. Therefore, the switches 17 and 19 are turned on to return to the normal mode in which the noise filter circuits 16 and 18 are invalidated. Then, the writing circuit 10 performs data writing to memory cells from timing T9.

<Read Processing 2 of Clock Pulse Monitoring Register>

The period of read processing 2 of the clock pulse monitoring register is a period from timing T10 to timing T12. The RD signal is changed to H at timing T11 when the command decoder circuit 12 recognizes the read command. Then, the CPM signal at L is output from the output circuit 14 during a period from timing T11 to timing T12.

As described above, in the embodiment, the abnormality detection flag in the clock pulse monitoring register 13 is output to the data DO terminal through the output circuit 14, and this can let an external master side recognize clock abnormality. Then, since the abnormality detection flag is reset by inputting the CS signal again or the like, the master can retry the write processing. At this time, since the noise filter circuits 16 and 18 are validated in the writing circuit 10, the noise resistance is high but the processing rate is decreased. Therefore, the master slows down the clock rate and retries the write processing. This can ensure a success in the retry of the write processing. Note that since the writing circuit 10 returns to the normal mode after completion of the retry, the rate of subsequent write processing is not decreased.

Note that the writing circuit 10 of the embodiment is not limited to the circuit structure including logic illustrated in FIG. 1 and the timing chart illustrated in FIG. 2 as long as the above function can be implemented. For example, a noise filter circuit and a switch circuit may be provided at the SCK terminal alone.

What is claimed is:

1. A nonvolatile memory device comprising:
    a first switch and a first noise filter circuit connected in parallel to a clock terminal;
    a command decoder circuit that decodes a command from data input from a data input terminal;
    a clock pulse monitoring circuit that compares the number of clocks input from the clock terminal with a prescribed number to detect abnormality in the number of clocks, and outputs an abnormality detection signal when the abnormality is detected;
    a clock pulse monitoring register that receives the abnormality detection signal and sets an abnormality detection flag;
    an output circuit that outputs the abnormality detection flag to outside; and
    a mode selection circuit that switches between a first state and a second state according to the abnormality detection flag, wherein
    in the first state, the first switch is turned on to invalidate the first noise filter circuit,
    in the second state, the first switch is turned off to validate the first noise filter circuit, and
    a data reading period after the abnormality detection flag is set is the second state.

2. The nonvolatile memory device according to claim 1, further comprising
    a second switch and a second noise filter circuit connected in parallel to a chip select terminal,
    wherein the second switch is turned on in the first state, and the second switch is turned off in the second state.

* * * * *

UNITED STATES PATENT AND TRADEMARK OFFICE
CERTIFICATE OF CORRECTION

PATENT NO. : 9,633,718 B1
APPLICATION NO. : 15/284962
DATED : April 25, 2017
INVENTOR(S) : Makoto Mitani et al.

Page 1 of 1

It is certified that error appears in the above-identified patent and that said Letters Patent is hereby corrected as shown below:

On the Title Page

Left column, insert item (65) as follows:
-- Prior Publication Data
US 2017/0103804 A1 April 13, 2017 --.

Signed and Sealed this
Fifteenth Day of May, 2018

Andrei Iancu
*Director of the United States Patent and Trademark Office*